(12) United States Patent   (10) Patent No.: US 12,607,945 B2
Hayashi   (45) Date of Patent: Apr. 21, 2026

(54) POSITION MEASURING METHOD, METHOD FOR MANUFACTURING ARTICLE, POSITION MEASURING APPARATUS, SEMICONDUCTOR MANUFACTURING APPARATUS, AND IMPRINT APPARATUS

(71) Applicant: CANON KABUSHIKI KAISHA, Tokyo (JP)

(72) Inventor: Nozomu Hayashi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 87 days.

(21) Appl. No.: 18/810,734

(22) Filed: Aug. 21, 2024

(65) Prior Publication Data

US 2025/0085645 A1 Mar. 13, 2025

(30) Foreign Application Priority Data

Sep. 13, 2023 (JP) ................................. 2023-148262

(51) Int. Cl.
*G03F 9/00* (2006.01)
*G03F 7/00* (2006.01)
(52) U.S. Cl.
CPC .......... *G03F 9/7042* (2013.01); *G03F 7/0002* (2013.01); *G03F 9/7088* (2013.01); *G03F 9/7092* (2013.01)
(58) Field of Classification Search
None
See application file for complete search history.

(56) References Cited

U.S. PATENT DOCUMENTS

| | | | | |
|---|---|---|---|---|
| 2005/0053273 A1* | 3/2005 | Ostrom | ................. | G03F 9/7015 430/311 |
| 2005/0281454 A1* | 12/2005 | Miyashita | ............. | G03F 9/7088 382/145 |
| 2010/0104128 A1* | 4/2010 | Arnz | ................. | G06V 10/7515 382/199 |
| 2013/0163004 A1* | 6/2013 | Matsumoto | ........... | G03F 7/0002 264/293 |

(Continued)

FOREIGN PATENT DOCUMENTS

| | | |
|---|---|---|
| JP | 2020077850 A | 5/2020 |
| KR | 1020080023650 A | 3/2008 |

OTHER PUBLICATIONS

Notice of Preliminary Rejection issued in Korean Appln. No. 10-2024-0119701 mailed Feb. 6, 2026.

*Primary Examiner* — Yung-Sheng Tsui
*Assistant Examiner* — Melody Tsui
(74) *Attorney, Agent, or Firm* — ROSSI, KIMMS & McDOWELL LLP

(57) ABSTRACT

A position measuring method includes an image capturing element for capturing an image of an alignment mark. The method includes first processing of setting processing areas on the image capturing element for capturing an image of the alignment mark and performing position measurement processing, and second processing of calculating a position of the alignment mark on the basis of the processing areas set in the first processing. The position of the alignment mark is calculated using a plurality of the processing areas set by shifting the processing areas from each other in units of one pixel of the image capturing element.

7 Claims, 6 Drawing Sheets

(56)          References Cited

U.S. PATENT DOCUMENTS

| | | | | |
|---|---|---|---|---|
| 2017/0151694 A1* | 6/2017 | Sato | ....................... | G03F 7/0002 |
| 2019/0026596 A1* | 1/2019 | Shiratsuchi | .......... | G06V 10/754 |
| 2020/0019066 A1* | 1/2020 | Miyaharu | ........... | G03F 7/70775 |
| 2020/0292935 A1* | 9/2020 | Yoshida | ................ | G03F 9/7042 |
| 2020/0301293 A1* | 9/2020 | Mitsugi | .................... | G03F 1/42 |
| 2023/0390993 A1* | 12/2023 | Matsuda | ............... | B29C 59/022 |
| 2024/0201606 A1* | 6/2024 | Mitsuyasu | ............ | G03F 7/2012 |

* cited by examiner

FIG. 6A
FIG. 6B
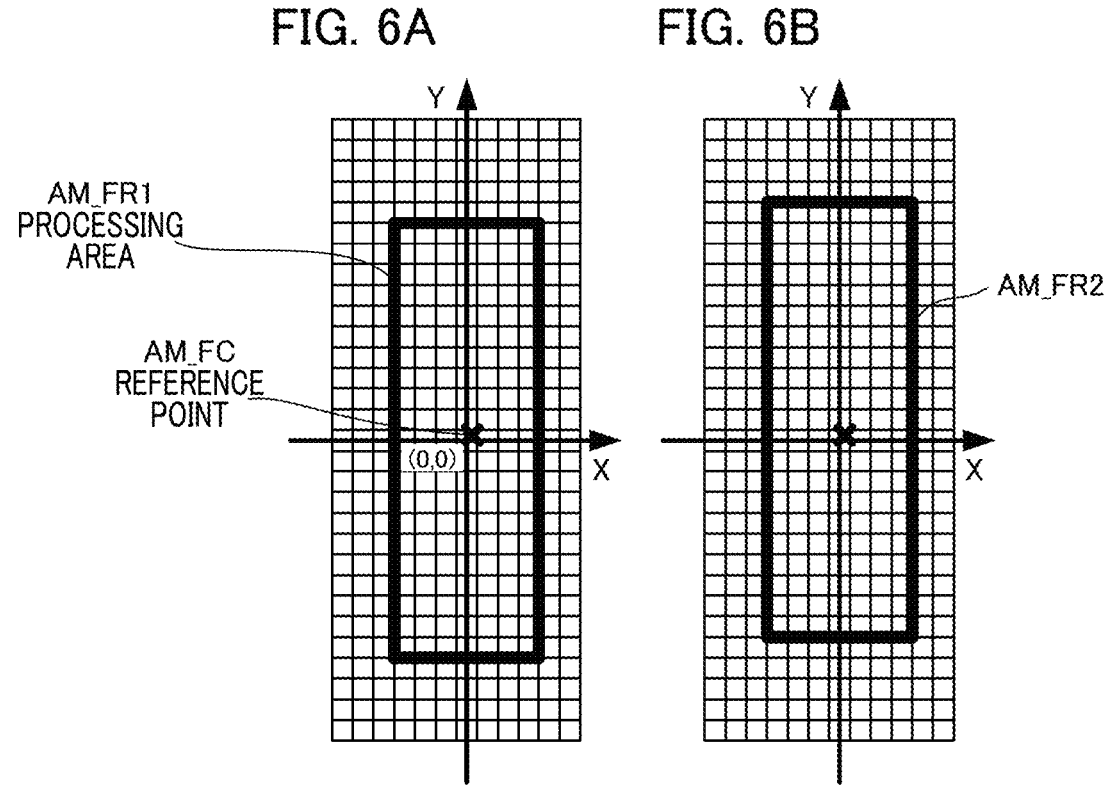
FIG. 6C
FIG. 6D
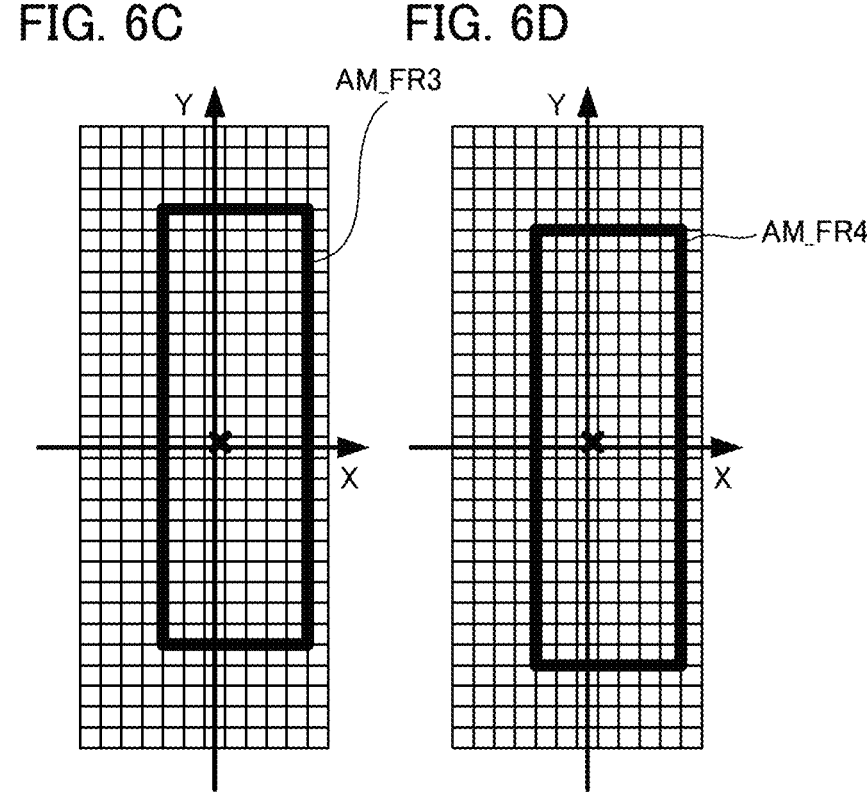

POSITION MEASURING METHOD, METHOD FOR MANUFACTURING ARTICLE, POSITION MEASURING APPARATUS, SEMICONDUCTOR MANUFACTURING APPARATUS, AND IMPRINT APPARATUS

BACKGROUND OF THE INVENTION

Field of the Invention

The present invention relates to a position measuring method, a method for manufacturing an article, a position measuring apparatus, a semiconductor manufacturing apparatus, an imprint apparatus, and the like.

Description of the Related Art

An imprint technology is a technology capable of forming a pattern using a mold on a resin supplied onto a substrate. The imprint technology has been proposed as one of lithography technologies for mass production of semiconductor devices, magnetic storage media, and the like.

An imprint apparatus using this imprint technology forms a pattern using a mold in a resin supplied onto a substrate. The imprint apparatus forms a pattern on a resin on a substrate by curing the resin in a state in which a mold and the resin are brought into contact with each other and separating the mold from the cured resin.

In a lithography apparatus such as an imprint apparatus, when a mold and a resin are brought into contact with each other, there is a need to accurately perform positional setting (alignment) of the mold and a substrate. In the imprint apparatus, for example, a die-by-die alignment method is employed as a method for positional setting.

The die-by-die alignment method is a method for performing positional setting by detecting alignment marks formed in shot areas on a substrate and alignment marks formed on a mold. Such a technology related to positional setting of a mold and a substrate has been proposed in the related art.

For example, Japanese Patent Laid-Open No. 2020-77850 describes a constitution and a processing method of alignment marks, in which rough detection marks and accurate detection marks are provided as the alignment marks and the rough detection marks are used for rough alignment between a mold and a substrate and identification of positions of the accurate detection marks.

That is, the positions of the accurate detection marks on an image capturing element in an alignment scope are identified by measuring the rough detection marks, and relative positions of the mold and the substrate are calculated by performing measurement processing with respect to processing areas for the accurate detection marks set in advance.

However, since the processing areas are allocated on the image capturing element in units of pixels, even if the relative positions of the alignment scope and the alignment marks change by an amount equal to or smaller than a pixel resolution, the processing areas set for the accurate detection marks cannot track the change in relative position.

SUMMARY OF THE INVENTION

According to an aspect of the present invention, a position measuring method includes an image capturing element for capturing an image of an alignment mark. The method includes first processing of setting processing areas on the image capturing element for capturing an image of the alignment mark and performing position measurement processing, and second processing of calculating a position of the alignment mark on the basis of the processing areas set in the first processing. The position of the alignment mark is calculated using a plurality of the processing areas set by shifting the processing areas from each other in units of one pixel of the image capturing element.

Further features of the present invention will become apparent from the following description of embodiments with reference to the attached drawings.

BRIEF DESCRIPTION OF THE DRAWINGS

FIGS. 6A to 6D are explanatory views of examples of processing areas on an image capturing element according to First Embodiment.

DESCRIPTION OF THE EMBODIMENTS

Hereinafter, with reference to the accompanying drawings, favorable modes of the present invention will be described using Embodiments. In each diagram, the same reference signs are applied to the same members or elements, and duplicate description will be omitted or simplified.

First Embodiment

Figure 1:
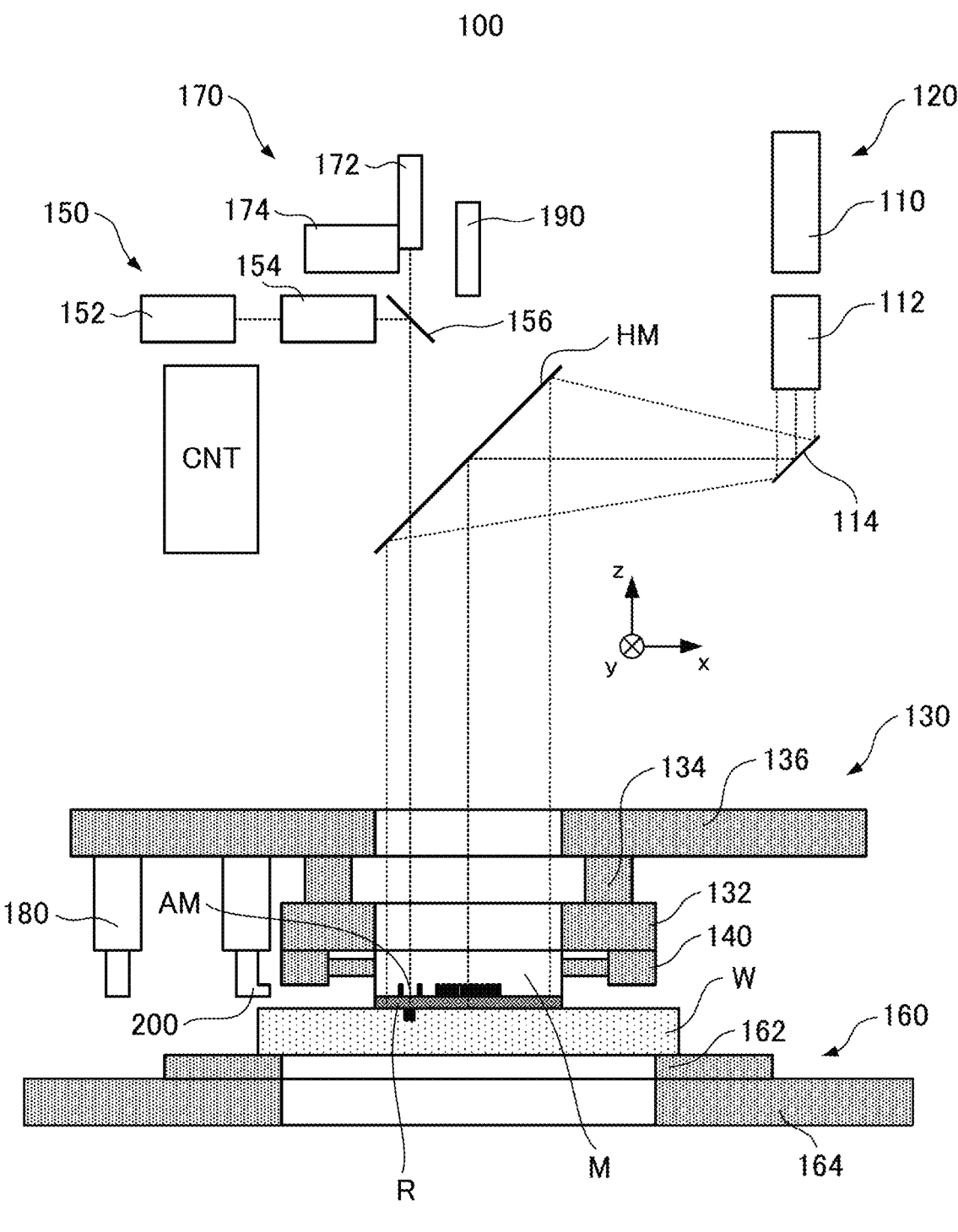
FIG. 1 is a view showing an example of a constitution of an imprint apparatus according to First Embodiment.

FIG. 1 is a view showing an example of a constitution of an imprint apparatus according to First Embodiment. In First Embodiment, an example of a UV light curing imprint apparatus that cures a resin by performing irradiation with UV light (ultraviolet light) will be described. However, the imprint apparatus may be an imprint apparatus that cures a resin by performing irradiation with light in a different wavelength range or an imprint apparatus that cures a resin using a different energy (for example, heat).

An imprint apparatus 100 according to the embodiment of the present invention is constituted to form a pattern in a plurality of shot areas by repeating an imprint shot cycle on a substrate. Here, one imprint shot cycle is a cycle for forming a pattern in one shot area on a substrate by curing a resin in a state in which a mold is pressed against the resin.

As shown in FIG. 1, for example, the imprint apparatus 100 according to First Embodiment includes an exposure mechanism 120, a mold operation mechanism 130, a mold shape correction mechanism 140, an alignment irradiation mechanism 150, a substrate driver 160, alignment mechanisms 170, and a control unit CNT.

The exposure mechanism 120 cures a resin (resist) R by irradiating the resin R with ultraviolet light via a mold M. In Present Embodiment, the resin R is an ultraviolet light curable resin. For example, the exposure mechanism 120 includes a light source unit 110 and an optical system 112.

For example, the light source unit 110 includes a light source such as a halogen lamp generating ultraviolet light (for example, i-line or g-line), and an elliptical mirror condensing light generated by the light source. The optical system 112 can include a lens for irradiating the resin R within a shot area with light for curing the resin, a half mirror HM, a mirror 114, and the like.

The optical system 112 may include an optical integrator in order to uniformly illuminate the mold M. In addition, light whose range is restricted by an aperture (not shown) of the optical system 112 is incident on the resin R on a substrate W via an image formation system and the mold M. A shot full-range observation scope 190 is a scope for observing the shot in its entirety and is used for checking an imprint state and a state of imprinting or filling.

The mold M is formed of a material that is transparent to the wavelength of ultraviolet light, for example, quartz, in order for ultraviolet light for curing the resin R to be transmitted therethrough. The mold M can be conveyed by a mold conveyance mechanism (not shown). For example, the mold conveyance mechanism includes a conveyance robot having a chuck such as a vacuum chuck.

For example, the mold operation mechanism 130 can include a mold chuck 132 holding the mold M, a mold drive mechanism 134 driving the mold M by driving the mold chuck 132, and a mold base 136 supporting the mold drive mechanism 134.

The mold drive mechanism 134 includes a positioning mechanism for controlling the position of the mold M with respect to six axes, and a mechanism for pressing the mold M against the substrate W or the resin R thereon or separating the mold M from the cured resin R.

Here, control with respect to six axes is control in respective directions of an X axis, a Y axis, and a Z axis and control in rotation directions around the respective axes in an XYZ coordinate system having a support surface of the mold chuck 132 (a surface supporting the substrate W) as an XY plane and a direction orthogonal thereto as the Z axis.

The mold shape correction mechanism 140 can be mounted in the mold chuck 132. For example, the mold shape correction mechanism 140 corrects the shape of the mold M by pressurizing the mold M in an outer circumferential direction using a cylinder that operates by means of a fluid such as air or oil. Alternatively, the mold shape correction mechanism 140 may include a temperature control unit controlling the temperature of the mold M so as to correct the shape of the mold M by controlling the temperature of the mold M.

The substrate W can be deformed (typically, expand or contract) through a process such as heat treatment. The mold shape correction mechanism 140 corrects the shape of the mold M such that an overlay error is regulated within an allowable range in accordance with such deformation of the substrate W.

A coating mechanism 180 consecutively coats areas for performing imprinting in the substrate W with the resin R or collectively coats the entire surface of the substrate W. The coating mechanism 180 may be provided inside the apparatus but may be provided in an external apparatus so as to collectively coat a substrate with the resin R.

For example, the coating mechanism 180 can have a tank accommodating a resin, a nozzle discharging a resin supplied from the tank through a supply channel to the substrate, a valve provided in the supply channel, and a supply amount control unit.

A gas supply mechanism 200 is a mechanism for supplying gas such as helium to the inside of a space of the mold operation mechanism 130 so as to prompt filling with the resin R. The inflow amount and the inflow timing of gas are optimized in advance in accordance with the imprint shot cycle.

Next, the mold M is pressed against the resin R on a substrate and irradiated with ultraviolet light in this state so that the resin is cured. Next, the same processing is executed with respect to the next shot area.

For example, the substrate driver 160 can include a substrate chuck 162 holding the substrate W, a substrate stage 164 driving the substrate W by driving the substrate chuck 162, and a stage drive mechanism (not shown). The stage drive mechanism can include a positioning mechanism for controlling the position of the substrate W by controlling the position of the substrate stage 164 with respect to six axes described above.

For example, each of the alignment mechanisms 170 can include an alignment scope 172 and an alignment stage mechanism 174. The alignment scope 172 can include an automatic adjustment scope (AAS) for positional setting the mold M and the shot areas of the substrate W.

The alignment scope 172 detects alignment marks formed on the mold M and alignment marks formed on the substrate W via the mold M. Although only one is shown in FIG. 1, a plurality of alignment mechanisms 170 are mounted.

The alignment scope 172 has an image capturing element capturing images of alignment marks AM periodically and repeatedly over an accumulation time set in advance. In addition, the alignment scope 172 calculates relative positions of the alignment marks on the mold M and the substrate W by the control unit CNT serving as an alignment measurement unit.

The control unit CNT measures a difference between shapes of shots (coordinates, rotations, magnifications, trapezoidal components, and the like) on the mold M and the substrate W on the basis of measurement results of the relative positions of the alignment marks and calculates a drive amount to be commanded to the substrate driver 160 on the basis of the difference.

For example, the alignment irradiation mechanism 150 can include a light source 152 such as a laser diode, a light amount adjustment mechanism 154 such as an ND filter, a half mirror 156 synthesizing the optical axis with the alignment mechanisms 170, and the like.

The light amount adjustment mechanism 154 is an adjustment mechanism capable of continuously changing the transmittance, such as a continuously variable-type ND filter capable of changing the transmittance in accordance with the light transmission position, or a liquid crystal-type ND filter capable of electrically controlling the transmittance by means of an applied voltage or the like.

The imprint apparatus 100 also includes a surface plate and a vibration isolator (damper) which are not shown. The surface plate supports the imprint apparatus 100 in its entirety and forms a reference plane when the substrate stage 164 moves. The vibration isolator removes vibration from the floor and supports the surface plate.

Figures 2A, 2B, 2C:
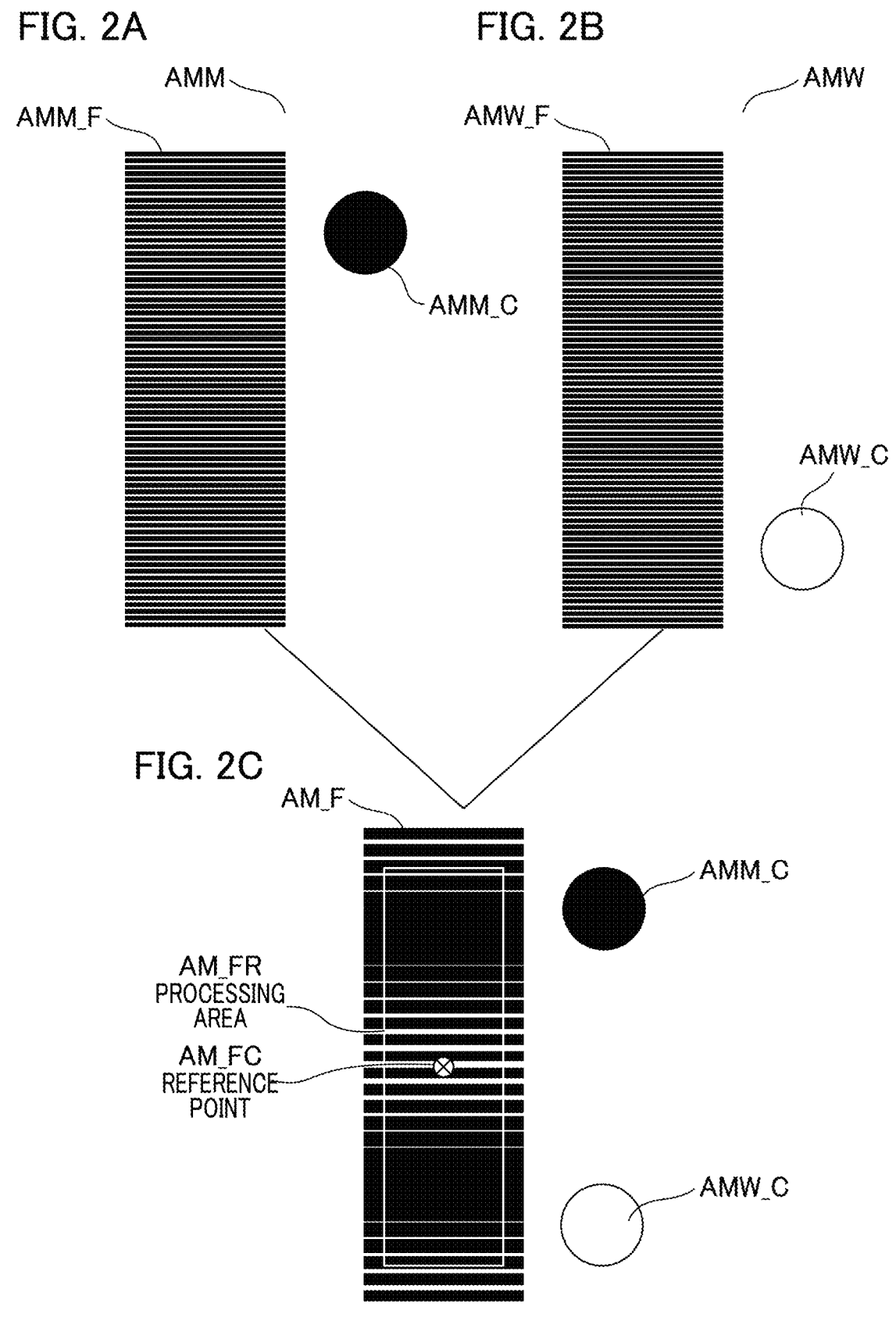
FIGS. 2A to 2C are views showing examples of alignment marks.

FIGS. 2A to 2C are views showing examples of alignment marks in which alignment marks formed on the mold M and the substrate W are shown as examples. An alignment mark AMM on the mold M (FIG. 2A) is constituted of a rough detection mark AMM_C and an accurate detection mark AMM_F. Similarly, an alignment mark AMW on the substrate W (FIG. 2B) is constituted of a rough detection mark AMW_C and an accurate detection mark AMW_F.

If the mold M and the substrate W are overlapped, a superimposed accurate detection mark AM_F is obtained as in FIG. 2C. The accurate detection mark AMM_F on the mold M and the accurate detection mark AMW_F on the substrate W are made in a line-and-space pattern with pitches different from each other and are also disposed in manner of overlapping each other. Therefore, if the substrate W is observed through the mold M, moire is generated in the superimposed accurate detection mark AM_F as in FIG. 2, and the relative positions of the mold M and the substrate W can be measured by detecting the phase of this moire.

Figure 3:
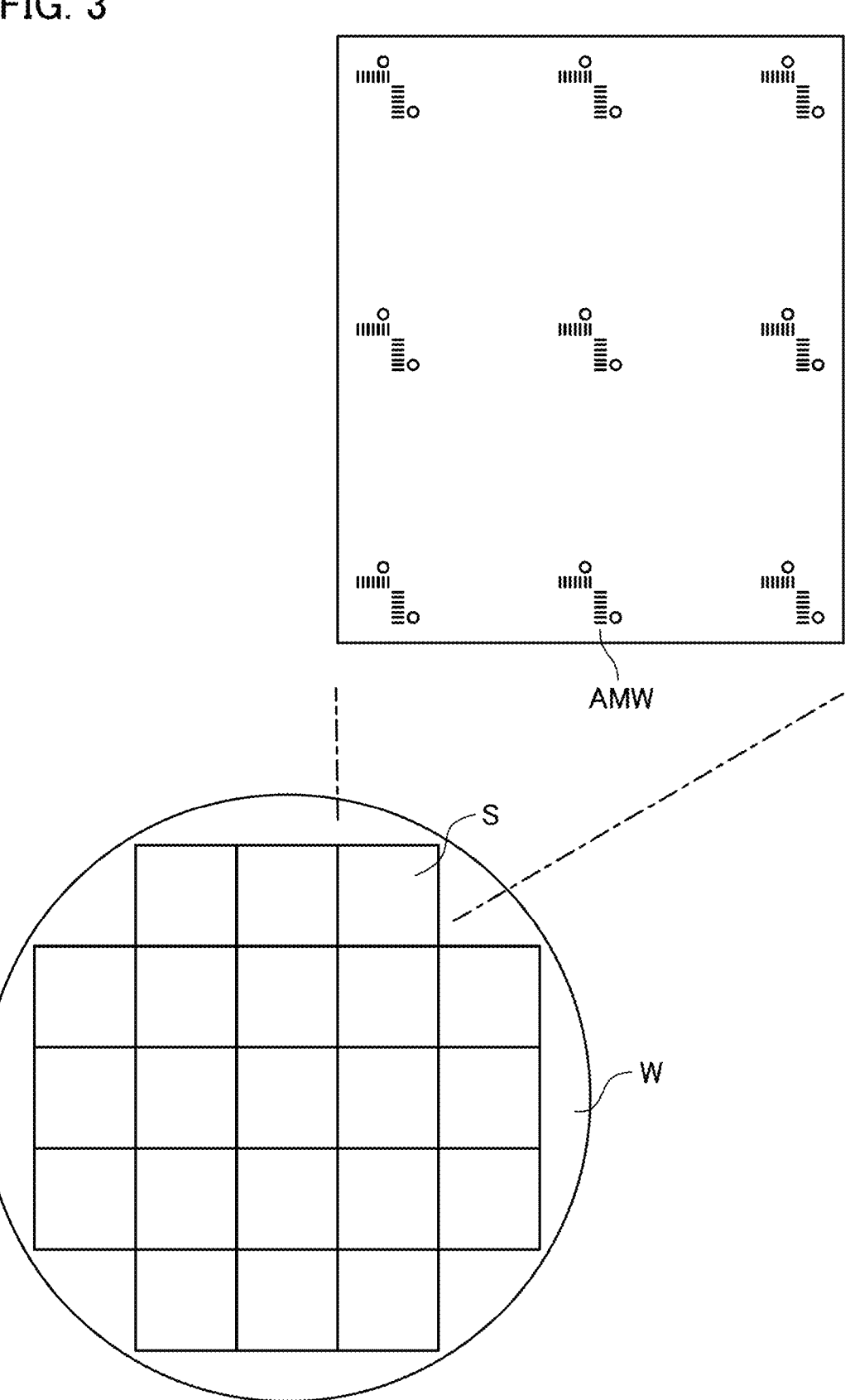
FIG. 3 is a view showing an example of a substrate and a shot array.

FIG. 3 is a view showing an example of a substrate and a shot array. As shown in FIG. 3, a plurality of shot areas S are formed on the substrate W, and a plurality of alignment marks are formed within each of the shot areas S.

Figure 4:
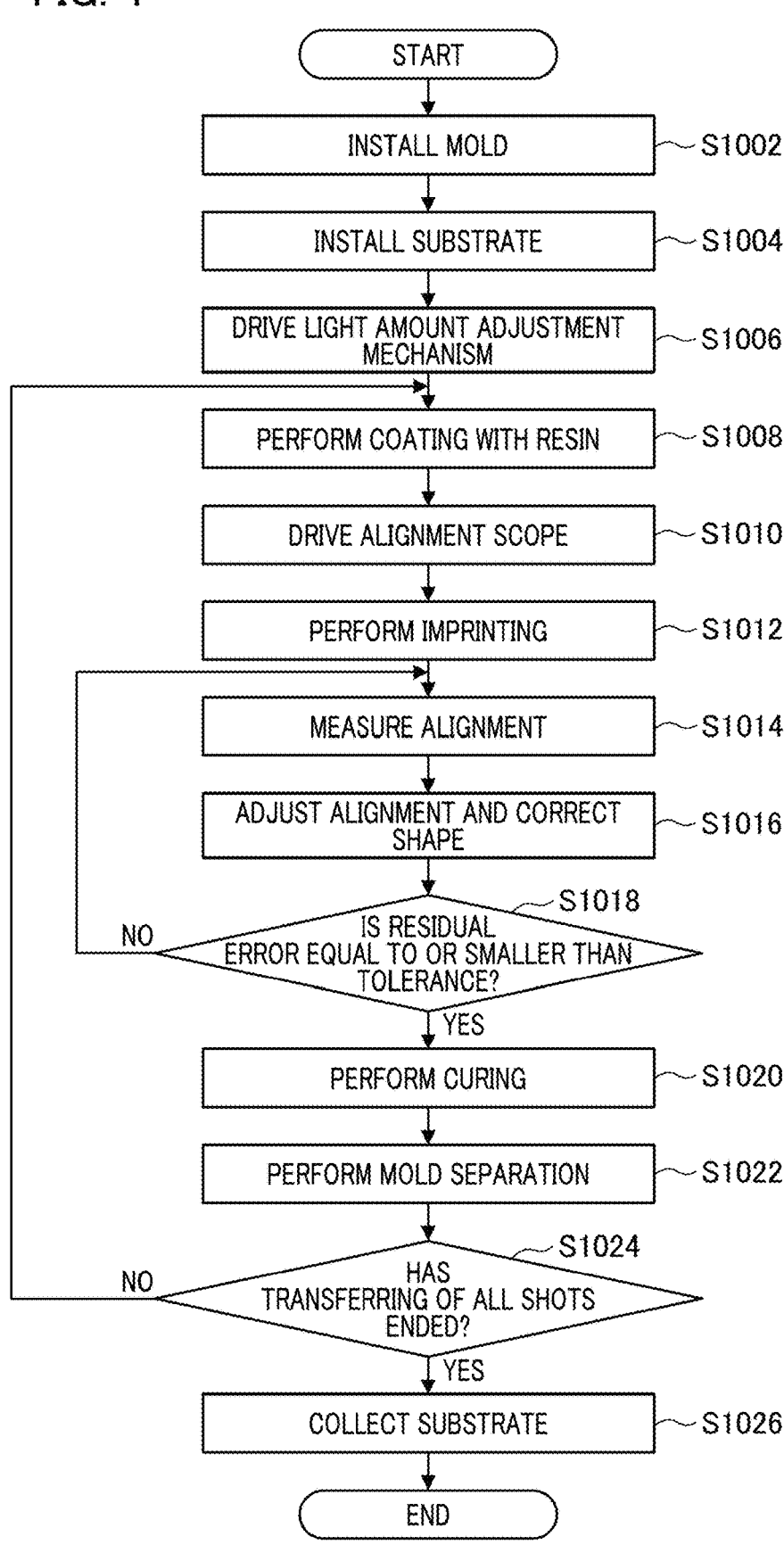
FIG. 4 is a flowchart showing an imprint method using an imprint apparatus 100 according to First Embodiment.

FIG. 4 is a flowchart showing an imprint method using the imprint apparatus 100 according to First Embodiment. Hereinafter, operation of the imprint apparatus 100 will be described with reference to FIG. 4. When a CPU or the like serving as a computer inside the control unit CNT executes a computer program stored a memory, operation of each step of the flowchart in FIG. 4 is consecutively performed.

First, in Step S1002, the mold M is conveyed to the mold chuck 132, is subjected to positioning, and is held by the mold chuck 132.

Next, in Step S1004, the substrate W is loaded onto the substrate chuck 162 by a conveyance mechanism (not shown) and is held by the substrate chuck 162. Here, it is assumed that at least a pattern on a first layer has already been formed on the substrate W together with the alignment marks.

Next, in Step S1006, the light amount adjustment mechanism 154 is driven to change the transmittance. At this time, data of the transmittance enabling the alignment scope 172 to correctly capture images of the alignment marks is measured and stored in advance. The transmittance of the light amount adjustment mechanism 154 is set so as to obtain a light amount for the shot to be imprinted can be measured in an optimal state on the basis of the stored data.

Next, in Step S1008, the area where imprinting is performed by the coating mechanism 180 is coated with the resin R. Regarding coating with the resin R, the entire surface of the substrate W may be coated in advance using an external apparatus. Next, in Step S1010, the alignment scope 172 is driven by the alignment stage mechanism 174 such that the alignment scope 172 comes to the positions of the alignment marks on the mold M.

Next, in Step S1012, the mold M is moved downward by the mold operation mechanism 130 so that the mold Mis pressed against the resin on the substrate W. Here, instead of driving the mold M, the mold M may be pressed against the resin by moving the substrate W upward. For example, the pressing load can be controlled using a load sensor that has been built into the mold drive mechanism 134.

Subsequently, after Step S1014, an alignment measurement method (position measuring method) is executed in accordance with a die-by-die alignment method. Specifically, images of the alignment marks on the mold M and the substrate W are captured by the alignment scope 172, and the relative positions of the mold M and the substrate W are measured by an image processing device (not shown).

Figure 5:
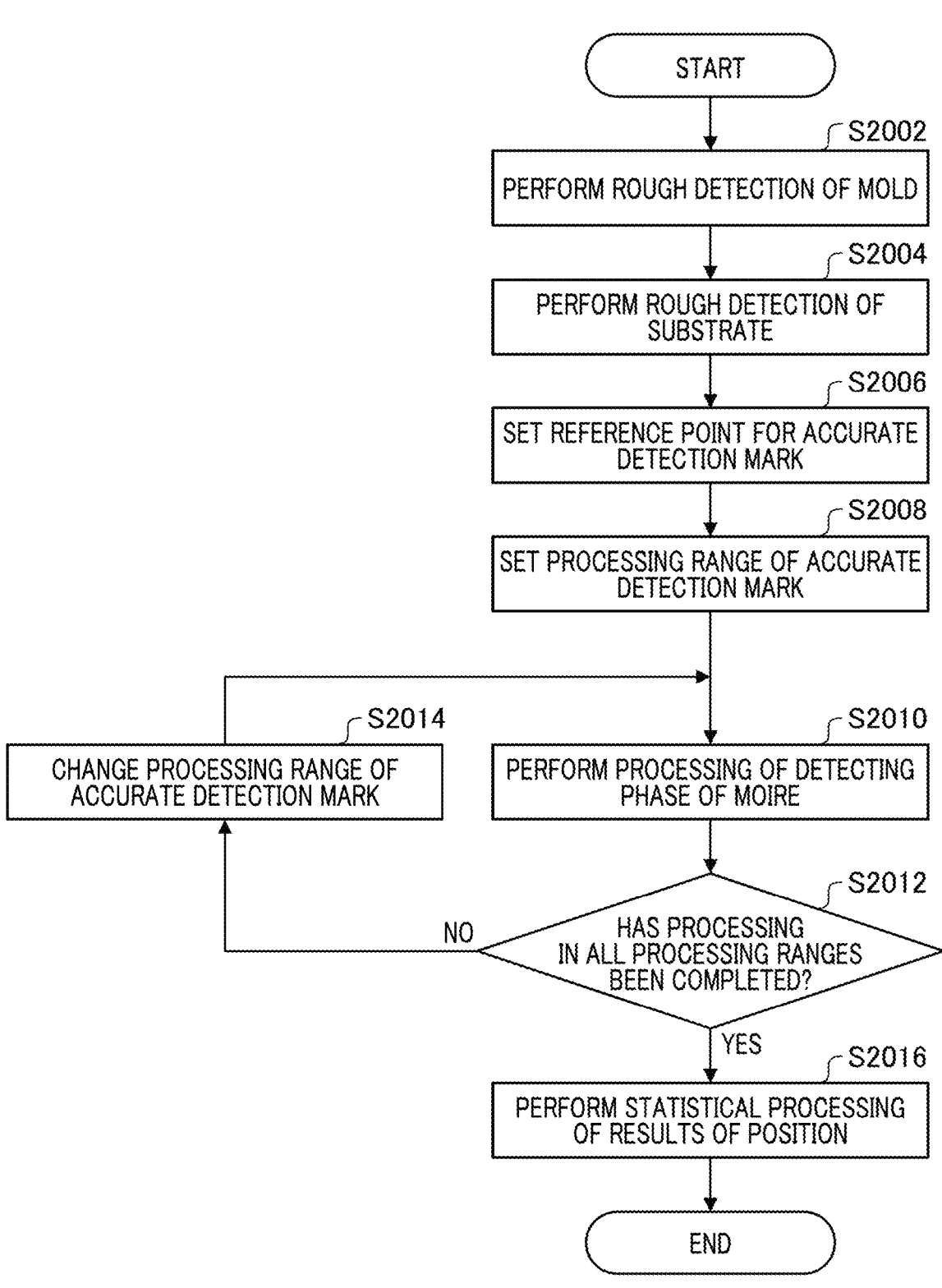
FIG. 5 is a flowchart showing an example of operation of alignment measurement performed by a control unit CNT in Step S1014.

FIG. 5 is a flowchart showing an example of operation of alignment measurement performed by the control unit CNT in Step S1014. When the CPU or the like serving as a computer inside the control unit CNT executes the computer program stored in the memory, operation of each step of the flowchart in FIG. 5 is consecutively performed.

In FIG. 5, in Step S2002, first, rough detection of the mold M is performed. Regarding rough detection of the mold M, the position of the rough detection mark AMM_C in FIG. 2C on the image capturing element is detected. Subsequently, in Step S2004, rough detection of the substrate W is performed. Regarding rough detection of the substrate W, the position of the rough detection mark AMW_C in FIG. 2C on the image capturing element is detected.

If rough detection of the mold M and the substrate W ends, in Step S2006, the position of a reference point AM_FC for the superimposed accurate detection mark AM_F on the image capturing element is set based on the rough detection marks. If the position of the reference point is set in this manner, there is a probability of misalignment between the position of the reference point and the pixel position of the image capturing element within one pixel.

In Step S2008, a processing area AM_FR of the superimposed accurate detection mark AM_F centered on the reference point AM_FC is set (FIG. 2C).

Here, Step S2008 functions as first processing (first processing unit) in which position measurement processing is performed by capturing images of the alignment marks using the image capturing element for capturing images of the alignment marks and processing areas on the image capturing element are set. In addition, in the first processing, the reference point for the alignment marks is set, and the processing areas centered on the pixel of the image capturing element closest to the reference point are set.

FIGS. 6A to 6D are explanatory views of examples of processing areas on the image capturing element according to First Embodiment. The grid in FIG. 6A expresses the pixel of the image capturing element of the alignment scope 172. In the example of FIG. 6A, the processing area AM_FR is set in units of pixels with the pixel closest to the reference point AM_FC for the superimposed accurate detection mark AM_F as a center pixel. In this example, a processing area AM_FR1 is set centered on the pixel (0,0).

In addition, in this example, the reference point for the superimposed accurate detection mark AM_F is on the right above the pixel center (0,0). Therefore, three processing areas AM_FR2, AM_FR3, and AM_FR4 respectively centered on pixels (0,1), (1,1), and (1,0) as nearby pixels close to the reference point for the superimposed accurate detection mark AM_F are set as well (FIGS. 6B to 6D).

For example, if the reference point for the superimposed accurate detection mark AM_F is on the left below the pixel center (0,0), for example, the three processing areas respectively centered on pixels (0,−1), (−1,−1), and (−1,0) as nearby pixels close to the reference point for the superimposed accurate detection mark AM_F may also be set.

Subsequently, in Step S2010, the phase of a moire signal of each of the four processing areas AM_FR1 to AM_FR4 of the set superimposed accurate detection mark AM_F is detected, and the relative positions of the mold M and the substrate W are calculated. Further, in Step S2012, it is judged whether the processing of all the four processing areas AM_FR1 to AM_FR4 of the four superimposed accurate detection marks AM_F defined above has been completed.

In Step S2012, if it is judged to be NO, after the processing areas are changed in Step S2014, the processing returns to Step S2010, and processing of detecting the phase of moire is performed. In Step S2012, if it is judged to be YES, the processing proceeds to Step S2016.

In Step S2016, processing results of all the processing areas AM_FR1 to AM_FR4 are subjected to statistical processing, and the final relative positions of the mold M and the substrate W are calculated. In the statistical processing, a weighted average using weights corresponding to distances between the reference point AM_FC for the super-imposed accurate detection mark AM_F and the centers (0,0), (0,1), (1,1), and (1,0) of the four processing areas is used, it is not limited thereto and may adopt a simple average or may be interpolation processing.

In this manner, statistical processing according to Present Embodiment includes using a weighted average, and the weights are determined on the basis of the distances between the reference point for the alignment marks and the center pixels of a plurality of processing areas.

Here, Step S2016 functions as second processing (second processing unit) in which the positions of the alignment marks are calculated on the basis of the processing areas set through the first processing. In addition, in Present Embodiment, the processing areas set through the first processing as described above are shifted in units of pixels of the image capturing element, and the second processing is performed using a plurality of processing areas set in a shifted manner.

That is, in Present Embodiment, the final position of the alignment mark is measured by performing the second processing using the plurality of processing areas set in a shifted manner, and the final position of the alignment mark is calculated by performing statistical processing of the obtained results of the plurality of position measurements.

In Step S2016, after the relative positions of the mold M and the substrate W is finally calculated, in Step S1016, the difference between shapes of shots (coordinates, rotations, magnifications, trapezoidal components, and the like) of the mold M and the substrate W are measured on the basis of the measurement results of the relative positions of the align-ment marks.

Moreover, in Step S1016, in addition to adjusting align-ment, the shape of the mold M is corrected by the mold shape correction mechanism 140 as necessary in order for the mold M to match the shapes of the shots on the substrate W.

In Step S1018, it is judged whether the difference between shapes of shots on the mold M and the substrate W is equal to or smaller than a tolerance. This is because, if the shapes are corrected by the mold shape correction mechanism 140, a correct error may remain in correction of the shape of the mold M due to a driving error or the like of the mold shape correction mechanism 140.

If it is larger than the tolerance, the processing returns to Step S1014. Measurement is performed again by the align-ment scope 172, and the shape of the mold is corrected until the difference between shapes of shots on the mold M and the substrate W is judged to be equal to or smaller than the tolerance set in advance in Step S1018.

If it is judged in Step S1018 that the residual error is equal to or smaller than the tolerance, curing the resin starts in Step S1020. That is, curing the resin starts by irradiating the resin with ultraviolet light via the mold M using the exposure mechanism 120.

If curing is completed, the mold M is separated from the cured resin by moving the mold M upward by the mold operation mechanism 130 in Step S1022. At this time, instead of driving the mold M, the substrate W may be moved downward.

In Step S1024, it is judged whether imprinting with respect to all the shot areas on the substrate has ended. If it is judged to be NO in Step S1024, that is, if there is a shot area in which imprinting has not been performed, the processing returns to Step S1008, and the foregoing pro-cessing is repeated for the next shot area.

Meanwhile, if it is judged to be YES in Step S1024, that is, if it is judged that imprinting with respect to all the shot areas has ended, in Step S1026, the substrate W is unloaded and collected from the substrate chuck 162 by a conveyance mechanism (not shown).

In the foregoing embodiment, in Step S2008 of FIG. 5, four processing areas centered on the nearby pixels of the reference point for the superimposed accurate detection mark AM_F are defined. However, the tolerance may be provided for the distance to the center of the pixel closest to the reference point for the superimposed accurate detection mark AM_F, and if the distance is equal to or smaller than the tolerance, only one processing area centered on the pixel may be set. In this case, the processing does not go through the loop of Step S2012 to Step S2014, the processing time can be shortened.

Statistical processing is not limited to four processing areas respectively centered on four pixels near the reference point and may adopt nine processing areas centered on nine pixels, for example, near the reference point. In addition, in Step S2006, when the reference point for the superimposed accurate detection mark AM_F is set, the position of the reference point for the superimposed accurate detection mark AM_F on the image capturing element is set based on the rough detection marks. However, for example, the reference point may be set on the basis of external shapes of the accurate detection marks.

In addition, in the foregoing embodiment, in the process-ing of the accurate detection marks, moire generated by overlapping the accurate detection mark AMM_F of the mold M and the accurate detection mark AMW_F of the substrate W is subjected to processing, but it is not limited to moire and need only be processing for the alignment marks of the mold M or the substrate W alone.

In addition, in Step S1018, it is described that the pro-cessing proceeds to the next step if the difference between shapes of shots on the mold M and the substrate W is equal to or smaller than the tolerance. However, even if it is not equal to or smaller than the tolerance, the processing may proceed to the next step when the time reaches an elapsed time set in advance from the start of alignment.

That is, if the distance between the reference point for the alignment marks and the pixel center of the pixel of the image capturing element closest to the reference point is equal to or smaller than a predetermined value, the second processing may be performed on the basis of the processing areas set in the first processing and the second processing using a plurality of processing areas may not be performed.

In the foregoing embodiment, the final position of the alignment mark is measured by performing the second processing using a plurality of processing areas, and the final position of the alignment mark is calculated by performing statistical processing of the obtained results of a plurality of position measurements. However, the final position of the alignment mark may be calculated by performing statistical processing of images from the plurality of processing areas and measuring the positions of the alignment marks through the second processing using the images subjected to statis-tical processing.

In addition, as above, Present Embodiment has presented an imprint apparatus using die-by-die alignment as an example. That is, an imprint apparatus including an imprint unit that aligns a mold and a substrate using the position measuring method according to the embodiment and forms a pattern on a surface of the substrate by bringing a pattern of the mold into contact with a resin on the surface of the substrate has been described as an example.

However, the present invention can also be applied to semiconductor exposure devices (semiconductor manufacturing apparatuses) such as steppers and scanners and can also be applied to global alignment. That is, the present invention can also be applied to semiconductor manufacturing apparatuses having a pattern formation unit that aligns a mold and a substrate using the position measuring method according to Present Embodiment and forms a pattern on a surface of the substrate using the mold.

As above, according to Present Embodiment, it is possible to provide a position measuring method capable of reducing measurement errors due to misalignment between processing areas in an alignment scope.

Second Embodiment

The productivity and quality, for example, during manufacturing of a microdevice such as a semiconductor device or an article such as an element having a fine structure are improved by using the position measuring apparatus, the position measuring method, and the like according to First Embodiment in a lithography apparatus or the like such as an imprint apparatus.

A method for manufacturing a device as an article (a semiconductor device, a magnetic storage medium, a liquid crystal display element, or the like) will be described. Such a manufacturing method may include pattern forming of forming a pattern of a mold on a surface of a substrate (a wafer, a glass plate, a film-shaped substrate, or the like) using a lithography apparatus.

Here, transferring of a pattern of the mold may include pattern forming of forming a flat pattern. In addition, a substrate is not limited to a base material alone and may include a substrate having a multi-layer structure. Alternatively, pattern forming of exposing a pattern to a photoconductor on a substrate using a lithography apparatus may be included.

Such a manufacturing method further includes processing of a substrate before or after the foregoing pattern forming. That is, the manufacturing method includes a method for manufacturing an article having aligning of aligning a mold and a substrate using the position measuring method according to First Embodiment, pattern forming of forming a pattern on a surface of the substrate using the mold, and processing of manufacturing an article by performing processing of the substrate.

For example, the processing can include removing of a residual film of the pattern, and developing. In addition, the processing can include known manufacturing such as etching of the substrate with the pattern as a mask, cutting (dicing) of chips from the substrate, electrical connecting (bonding) of a chip by disposing it in a frame, and sealing (molding) with a resin.

Since the method for manufacturing an article in a lithography apparatus or the like such as an imprint apparatus using the position measuring apparatus, the position measuring method, and the like according to Present Embodiment has higher measurement accuracy than those in the related art, it is advantageous in at least one of performance, quality, productivity, and production costs of an article.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

In addition, as a part or the whole of the control according to the embodiments, a computer program realizing the function of the embodiments described above may be used for the position measuring method or the like through a network or various storage media. Then, a computer (or a CPU, an MPU, or the like) for the position measuring method or the like may be configured to read and execute the program. In such a case, the program and the storage medium storing the program configure the present invention.

In addition, the present invention includes those realized using at least one processor or circuit configured to perform functions of the embodiments explained above. For example, a plurality of processors may be used for distribution processing to perform functions of the embodiments explained above.

This application claims the benefit of priority from Japanese Patent Application No. 2023-148262, filed on Sep. 13, 2023, which is hereby incorporated by reference herein in its entirety.

What is claimed is:

1. A position measuring method using an image capturing element for capturing an image of an alignment mark comprising a rough detection mark and an accurate detection mark, the method comprising:

first processing of setting processing areas on the image capturing element for capturing an image of the alignment mark and performing position measurement processing, the processing areas comprising multiple pixels, and a reference point for the alignment mark is set and the processing areas centered on a pixel of the image capturing element closest to the reference point are set; and second processing of calculating a position of the alignment mark on the basis of the processing areas set in the first processing, wherein the position of the alignment mark is calculated using a plurality of the processing areas set by shifting the processing areas from each other in units of one pixel of the image capturing element.

2. The position measuring method according to claim 1, wherein position measurements of the alignment mark are performed by performing the second processing using the plurality of the processing areas set in a shifted manner, and the position of the alignment mark is calculated by performing statistical processing of obtained results of a plurality of the position measurements.

3. The position measuring method according to claim 2, wherein the statistical processing includes using a weighted average, and a weight is determined on the basis of a distance between the reference point for the alignment mark and a center pixel of each of the plurality of the processing areas.

4. A method for manufacturing an article comprising:

aligning a mold and a substrate using the position measuring method according to claim 1;

forming a pattern on a surface of the substrate using the mold; and processing of manufacturing an article by processing the substrate.

5. A position measuring apparatus comprising:

an image capturing element for capturing an image of an alignment mark comprising a rough detection mark and an accurate detection mark; and at least one processor or circuit configured to function as:

a processing unit configured to set processing areas on the image capturing element for capturing an image of the alignment mark and performing position measurement processing, and calculate a position of the alignment mark on the basis of the set processing areas, the processing areas comprising multiple pixels, and a reference point for the alignment mark is set, and the processing areas centered on a pixel of the image capturing element closest to the reference point are set, wherein the processing unit is further configured to calculate the position of the alignment mark using a plurality of the processing areas set by shifting the processing areas from each other in units of one pixel of the image capturing element.

6. A semiconductor manufacturing apparatus comprising: the position measuring apparatus according to claim 5; and a pattern formation unit configured to align a mold and a substrate using the position measuring apparatus, and form a pattern on a surface of the substrate using the mold.

7. The semiconductor manufacturing apparatus according to claim 6, wherein the semiconductor manufacturing apparatus is an imprint apparatus forming the pattern on the surface of the substrate by bringing the pattern of the mold into contact with a resin on the surface of the substrate.

* * * * *